United States Patent
Hossain et al.

(10) Patent No.: US 6,954,909 B2
(45) Date of Patent: Oct. 11, 2005

(54) METHOD FOR SYNTHESIZING DOMINO LOGIC CIRCUITS

(75) Inventors: Razak Hossain, San Diego, CA (US); Fabrizio Viglione, St. Martin d'Heres (FR); Bernard Bourgin, San Diego, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 145 days.

(21) Appl. No.: 10/248,721

(22) Filed: Feb. 12, 2003

(65) Prior Publication Data

US 2004/0158807 A1 Aug. 12, 2004

(51) Int. Cl.[7] ............................................. G06F 17/50
(52) U.S. Cl. ............................................. 716/2; 716/18
(58) Field of Search ............................... 716/1, 2, 6, 18

(56) References Cited

U.S. PATENT DOCUMENTS

| 5,041,742 | A | | 8/1991 | Carbonaro |
| 5,883,529 | A | | 3/1999 | Kumata et al. |
| 5,930,148 | A | * | 7/1999 | Bjorksten et al. ............... 716/6 |
| 6,209,121 | B1 | * | 3/2001 | Goto ............................. 716/6 |
| 2004/0155678 | A1 | | 8/2004 | Anderson et al. |

* cited by examiner

Primary Examiner—Thuan Do
(74) Attorney, Agent, or Firm—Lisa K. Jorgenson; William J. Kubida

(57) ABSTRACT

A method for synthesizing a domino logic circuit design (18) from a source circuit definition (14) using a static logic circuit synthesis tool (12) includes generating a preliminary domino logic circuit (26) design using the circuit synthesis tool (12) and optimizing an attribute of the preliminary domino logic circuit design by substituting a static cell design for a domino cell design having a same function in the preliminary domino logic circuit design (30).

14 Claims, 4 Drawing Sheets

METHOD FOR SYNTHESIZING DOMINO LOGIC CIRCUITS

BACKGROUND OF INVENTION

1. Field of Invention

This invention relates to improvements in methods for making or synthesizing logic circuits of the type that use domino logic circuits and principles.

2. Relevant Background

Recently, domino logic circuits and design have been receiving the attention of logic circuit designers and fabricators. Domino logic is a precharged, non-inverting family of Complementary Metal Oxide Silicon (CMOS) logic that uses multiple clock phases to effect high-speed operation. Domino logic is faster than standard static logic, but it is more difficult to design because of its increased complexity, primarily in the clocking network.

Typically in domino logic, at least a "precharge" clock phase is used, followed by an "evaluate" clock phase. During the precharge phase, when the clock is low, the output of the cell goes low. During the evaluate phase, when the clock is high, the output of the cell can only transition from a low to a high value. This is in contrast to standard static logic typically used with CMOS technology. In static logic designs, the output of the cell can rise or fall, depending on the input conditions, during normal operation.

Skew-tolerant clocking can be applied to either static or domino logic. Skew-tolerant clocking requires three or more overlapping clocks to be supplied to the design.

In the fabrication of static and domino logic designs, various synthesis techniques may be employed. In general, synthesis refers to a method by which a gate level logical implementation of a design is generated based on a high level functional description. "Gate level" is used herein to refer to a logic function level, such as an AND function, OR function, etc, rather than at a gate level as a part of an individual MOS device component.

Logic synthesis is usually carried out using logic optimization and technology mapping. Logic optimization refers to optimizing and reducing the logic in a technology independent manner. Technology mapping refers to an optimal mapping, based on some cost function such as timing, of the cells in a library to the logic.

Microprocessor performance in recent years has significantly exceeded predictions made as late as 1997 in the Semiconductor Industry Association (SIA) roadmap. The increased performance of microprocessors can be attributed to their deeply pipelined microarchitectures and their increased utilization of sophisticated design styles, lead primarily by domino logic. With the application of better methodologies (primarily microarchitectural, such as pipelining and logic design) in ASIC design, it has been suggested that domino logic is becoming the primary differentiator between custom and ASIC design styles. This indicates the continued use of domino logic in custom designs, as well as the increasing competitive benefits in using domino logic modules for critical paths in more general design methodologies.

A primary limitation to using domino logic has been the need to employ time-consuming custom design implementation techniques to construct domino circuits. While such design techniques can lead to high performance implementation, with the exception of microprocessor and high-end computational units, the techniques are not cost or time effective for most market segments. For lower-end circuits, on the other hand, the automatic synthesis of static logic has become a standard design technique.

The difficulty in synthesizing domino logic relates to two major differences between the design styles of domino and static logic modules. First, domino logic is non-inverting. This implies that no inverters or other inverting cells can be used in the synthesis process. Many commercial synthesis techniques will only synthesize a circuit from a library that contains an inverter. Second, domino logic operates alternately in the precharge and evaluate modes. Consequently, the clocking system in domino logic must mask the dead time during cell precharge in order to ensure that it is not added to the critical path delay. This requires a relatively extensive and complex clocking system.

The benefits of using domino logic have lead to a number of proposed solutions to the synthesis problems. Many of the proposals concentrate on solving the first problem mentioned above, namely, to build the logic function with non-inverting cells. However, these solutions generally have at least three practical limitations from an industrial perspective.

First, the work on domino synthesis frequently involves the development of synthesis tools. Most semiconductor companies do not wish to become involved in the complex and burdensome task of supporting a synthesis tool. Second, previous work on domino synthesis generally does not deal in detail with the clocking scheme. Third, previous work on domino synthesis is unclear about the definitions of or distinctions between the static and domino regions. The basic assumption is that the logic will be implemented with both static and domino gates. While the problem is interesting, especially in academia (optimal partitioning is a large and active research area), it is currently of limited utility in practical applications. This is because a domino-to-static interface requires the domino values be latched, which adds complexity and delay if robustly done. Also, experience has shown that the static logic slows down the overall circuit module. While we wish to mix static and domino logic, our goal is for this to be done with static cells seamlessly with domino cells, without separate regions constituting domino only and static only cells.

One method which has been employed for synthesizing domino logic begins by mapping an RTL circuit description to a set of AND gates, OR gates, and inverters. The inverters are then pushed towards the inputs by recursively applying DeMorgan's Law to any inverter at the output of a logic device. This procedure is called "bubble-pushing". At the end of bubble-pushing most of the inverters will have been moved to the primary inputs, except those which are trapped in the circuit. Sometimes, for example, inverters become trapped when both an inverted and an uninverted version of an internal signal are needed. Some of these trapped inverters can be removed if they drive different outputs by changing the output phase of signals. This is acceptable since the signal can be easily inverted in the output flip-flop. This procedure is called "output phase optimization".

At the end of output phase optimization, some inverters may still be trapped in the network. These signals are generated by providing the input fan-in cone for them starting at the primary inputs to the circuit. These cells are in the binate region of the logic, which may be redundantly implemented. The other cells are part of the unate region, in which no inverting logic is present. This logic is directly mapped to single rail domino cells.

While this procedure leads to functionally correct domino implementations, it does have certain limitations. First, all logic mappings after the first are limited to technology mappings and drive strength changes. Allowing a plurality of global mapping passes may lead to the inclusion of inverters in the logic, which is not acceptable. Synthesis of arbitrary functions to only inverters, AND gates, and OR gates leads to a sub-optimal implementations compared to directly mapping the design to a larger library. Second, a number of technology mapping passes needs to be performed for the binate regions, the unate regions, and the input inverters. The logic then needs to be reassembled. Finally, since many commercially available synthesis tools will not synthesize logic unless an inverter is in the library, often a dummy inverter has to be incorporated in the library. In order to ensure that the dummy inverter is never used, it is assigned an extremely large area and delay. Nevertheless, despite these efforts, the dummy inverter is nevertheless sometimes incorporated into the design, rendering the entire circuit design useless. It is also uncertain how the inclusion of such circuits which are in the library but not intended to be used affects the quality of synthesis.

SUMMARY OF INVENTION

Thus, according to a preferred embodiment of the invention, a method is presented for synthesizing domino logic.

According to the method, many of the complexities of designing with domino logic are overcome and, a modified version of skew-tolerant clocking into the synthesis method is automatically incorporated. The proposed flow can also be easily modified support traditional two-phase clocking schemes instead of skew-tolerant domino for the domino logic.

One of the advantages of the invention is that an improved domino synthesis is provided.

Another advantage is that a modified version of skew-tolerant clocking is incorporated automatically into the synthesis flow.

Yet another advantage is that in many cases the domino synthesis method of the invention is faster than the domino synthesis methods used heretofore.

One particular advantage of the invention is that the domino synthesis method uses existing, advanced static synthesis tools by defining a cell-timing model without a clock pin and in which the fall delays are kept equal to rising delays.

Another advantage of the invention is that synthesis and bubble-pushing are applied to the actual library of domino cells, which have been characterized to accurately reflect the evaluated delays. The bubble-pushing algorithm utilizes the fact that the cell library specifies the logically dual cell for each cell. Synthesizing the design on an actual library leads to better synthesis results than limiting the synthesis only to an AND gate, an OR gate, and an inverter.

Yet another advantage of the invention is that the binate regions may be mapped using dual rail cells, which leads to a smaller and lower power implementation.

Still another advantage of the invention is that the output phase assignment procedure leads to a lower area requirement than that of previous approaches because the actual area penalty for measuring the cost of logic duplication is used instead of technology independent criteria. This leads to a better solution for either an optimal or an heuristic solution to the output phase assignment problem.

Still yet another advantage of the invention is that by using behavioral insertion of flip-flops the design can be automatically and efficiently partitioned into different phase regions. This enables skew-tolerant domino clocking to be incorporated for the design. This also allows the partition regions to be modified so that the actual implementation will less likely have dead time when waiting for phases.

Another advantage of the invention is that the functional problems due to shoot-through or different phase gate fan-in are essentially eliminated.

Yet another advantage of the invention is that because the design may utilize flip-flops that enter precharge when the clock falls, even though a flip-flop is on a first phase $\phi 1$, it can still can drive a cell on the same phase.

Still another advantage of the invention is that since the flip-flops which may be used may also have a static logic slave stage, the static logic slave stage can be used for data retention during testing.

These and other objects, features, and advantages will become apparent to those skilled in the art from the following detailed description, when read in conjunction with the accompanying drawing and appended claims.

According to a broad aspect of the invention, a method is presented for synthesizing a domino logic circuit design from a source circuit definition using a static logic circuit synthesis tool. The method includes generating a preliminary domino logic circuit design using the circuit synthesis tool. The method also includes optimizing an attribute of the preliminary domino logic circuit design by substituting a static cell design for a domino cell design having a same function in the preliminary domino logic circuit design.

According to another broad aspect of the invention, a method is presented for synthesizing a domino logic circuit design from a logic circuit design using a static logic synthesis tool. The method includes bounding inputs and outputs of the logic circuit design by flip-flops having static slave latches to enable data at outputs of the flip-flops to be retrieved when the flip-flops enter precharge modes, and mapping the logic circuit design onto a domino logic cell library having cells that are described as static cells.

BRIEF DESCRIPTION OF DRAWINGS

The invention is illustrated in the accompanying drawings, in which.

DETAILED DESCRIPTION

According to a preferred embodiment of the invention, a domino logic synthesis solution is provided that utilizes existing synthesis tools, such as BuildGates™ synthesis tool available from Cadence Design Systems, Inc., of San Jose, Calif., the Design Compiler™ synthesizer available from Synopsys, Inc. of Mountain View, Calif., or other suitable tool. Although such synthesis tools are not used directly to synthesize domino functions, the built-in utilities and programming interfaces of such tools may be used to achieve the desired goals.

One of the ways by which the method according to one embodiment of the invention operates is to deal in detail with the clocking scheme. Since the clocking scheme is a fundamental attribute of domino logic, real world applicability requires it to be considered early in synthesis. According to the invention, a skew-tolerant approach to domino logic is used as the clocking scheme around which the synthesis tool should be defined. We believe that skew-tolerant domino logic is the highest performance domino-clocking scheme, while still being robust enough to be incorporated in a synthesis flow. The different clock phases needed for the skew-tolerant circuits can be provided by a PLL or by on-chip control logic (if a faster clock is available on-chip), allowing the use of the phases to be automated. It should be mentioned that the techniques described here for synthesis and phase assignment of domino logic can also be applied to other clocking schemes, including, two-phase clocking schemes.

In order to constrain the synthesis problem, the synthesis flow conceptually considers the logic to be bounded by edge triggered flip-flops at the inputs and outputs. While flip-flops introduce "hard edges", which limit performance somewhat, their penalties are reduced by using domino flip-flops, which have a very low setup time. Optionally, since the primary system clock will also be the first phase of the domino logic, a special set of edge-triggered flip-flops may be considered for domino synthesis. Although these flip-flops are edge triggered, they may be constructed to enter precharge when the clock falls (essentially acting as a domino gate). In addition, they may include a static slave latch for scan testing and ensuring that the stored data can be retrieved, even after the output of the flip-flop enters precharge. Examples of such flip-flop circuits may be seen in copending patent application Ser. No. 10/248,719 filed on even date herewith, and assigned to the assignee hereof.

Figure 1:
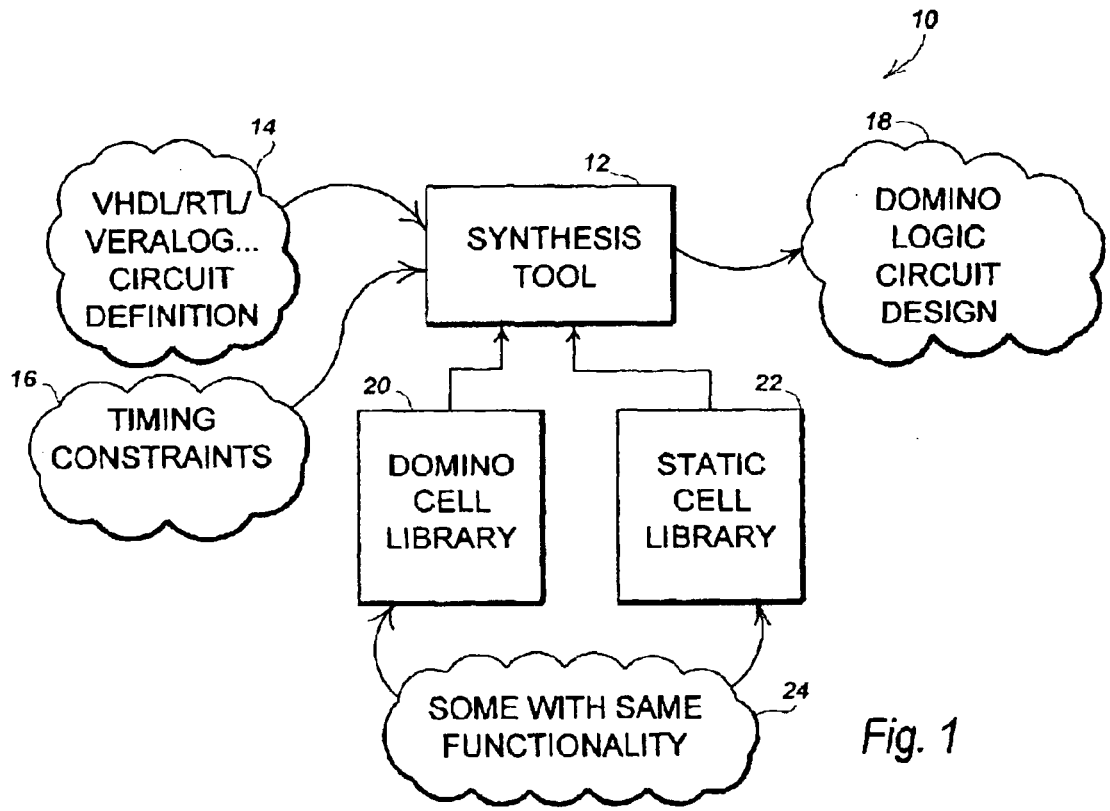
FIG. 1 is a diagram showing an environment and process for performing a domino logic circuit design, in accordance with a preferred embodiment of the invention.

FIG. 1, to which reference is now made, is a diagram showing a conceptual environment and process for performing a domino logic circuit design, in accordance with a preferred embodiment of the invention. It is noted that the overall performance and operation of the synthesis tool 10 shown in FIG. 1 is greatly simplified from that of an ordinary synthesis process flow, many of the steps being omitted as being well known in the domino logic circuit synthesis process art.

The environment 10 uses a synthesis tool 12, which may be a well-known static logic synthesis tool, such as the BuildGates™ or Design Compiler™ synthesis tools mentioned above. Such synthesis tools are well known in the art, and are not described in detail herein.

The synthesis tool 12 is of the type that accepts a circuit definition, for example, in a high definition level language such as VHDL, RTL, Verilog™, or the like, denoted by the cloud 14. Additionally, the synthesis tool 12 may receive timing constraint definitions, denoted by cloud 16, in well-known manner. The synthesis tool operates to generate at its output a domino logic circuit design, sometimes in the form of a netlist, denoted by cloud 18. The domino logic circuit design 18 may be specially constructed, in accordance with the operating constraints and operating conditions, singly or in combination, placed on the synthesis tool 12, all as described below as a part of the present invention.

More particularly, the synthesis tool 12 has associated with it both a domino cell library 20 and a static cell library 22. The static cell library 22 contains static cell definitions of at least some of the cells of the domino cell library, as denoted by the cloud 24.

Figure 2:
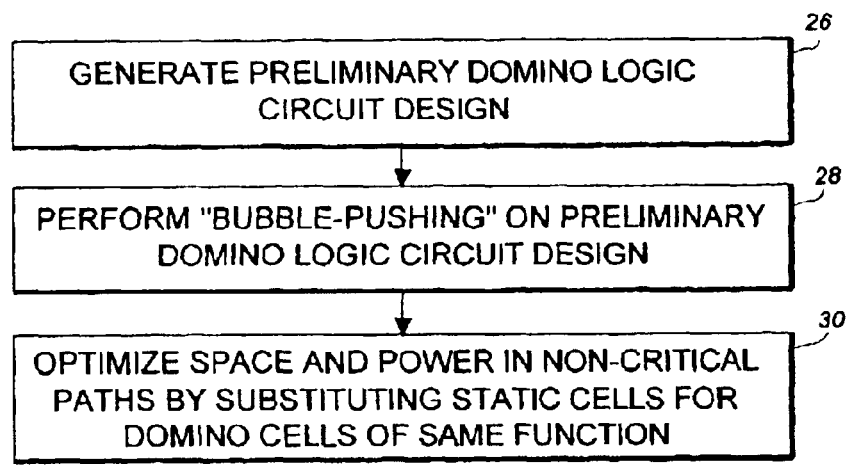
FIG. 2 is a flow chart showing one manner by which a static logic synthesis tool may be operated in generating a domino logic circuit design or netlist, in accordance with a preferred embodiment of the invention.

In accordance with a broad aspect of the invention, the synthesis tool 12 is operated to perform at least the following steps, which are shown in detail in the flow diagram of FIG. 2, to which reference is now additionally made.

As a first step, the synthesis tool 12 may be operated to generate a preliminary domino logic circuit design, based upon the domino cells contained in the domino cell library 20, as shown in block 26. As shown in block 28, "bubble-pushing" may then performed on the domino logic circuit design that has been generated in the preliminary step. The "bubble-pushing" operates to move as many of the internally created inverters in the preliminary domino logic circuit as possible to the inputs and outputs of the preliminary domino logic circuit design.

As shown in box 30, the preliminary domino logic circuit design is then optimized, in space and/or power by substituting static cells from the static cell library 22 for domino cells that have the same function. For example, if an AND domino cell is found in the preliminary domino logic circuit design, a static AND gate may be substituted for it from the static cell library 22. Preferably, the static cells may have larger time delays than the faster domino cells that are being replaced, and are placed in non-critical paths of the preliminary domino logic circuit design, so that the overall circuit does not violate the timing constraints defined in cloud 16 that are provided to the syntheses tool 12. The domino logic circuit design 18 is then optimized, as shown in box 30 of FIG. 2.

Figure 3:
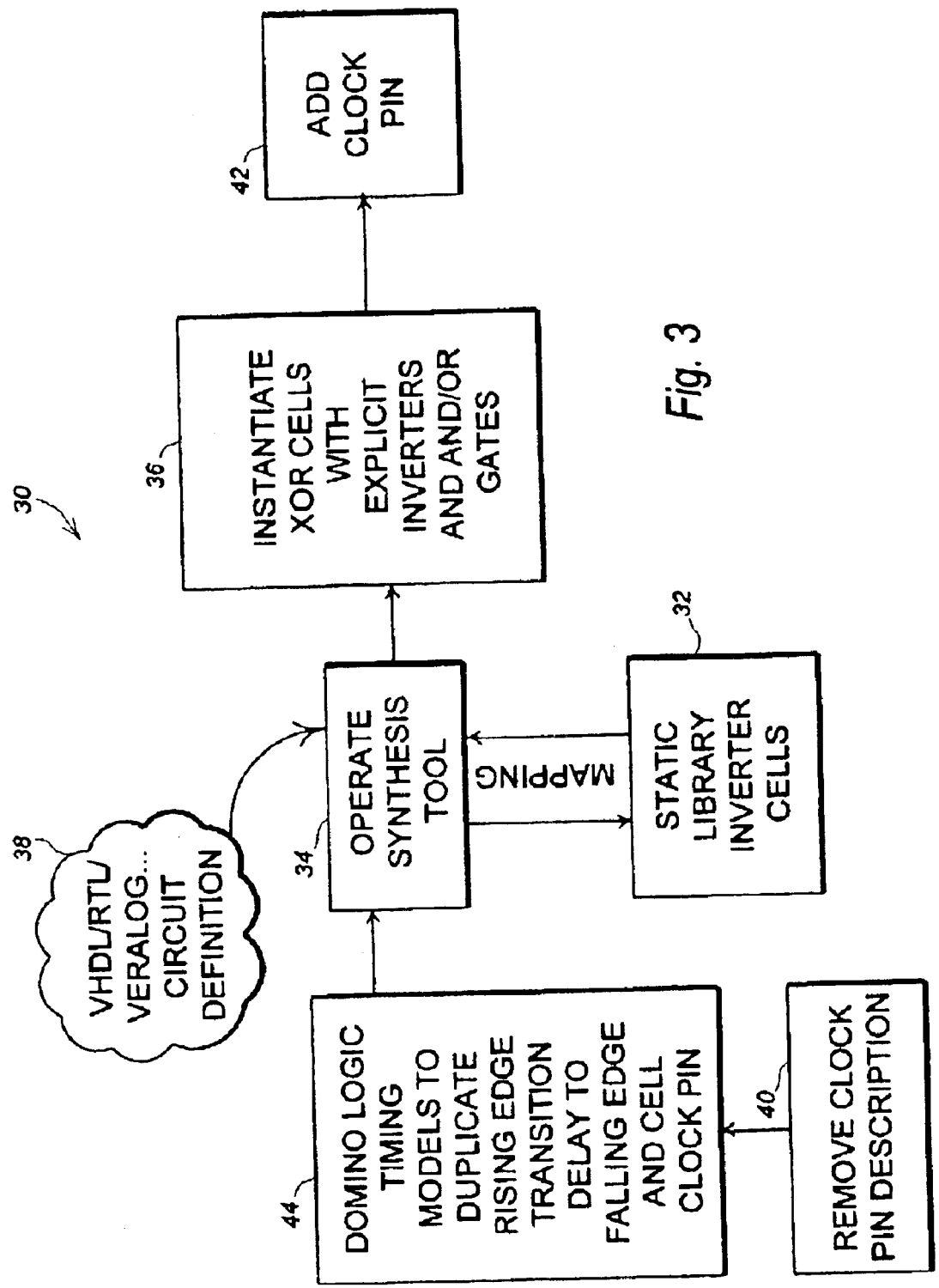
FIG. 3 is a flow diagram in which at least some of the cells may be described as static gates for use in the operation of the synthesis tool, according to one aspect of the invention.

With reference now additionally to FIG. 3, according to one aspect of the invention, a flow diagram 30 is shown illustrating a process in which the cells are described as static gates for use in the operation of the synthesis tool 34. A limited set of inverters from a static standard cell library 32 are also provided, shown as a part of the library upon which the synthesis tool 34 may draw. This allows larger inverters, for instance, up to a drive 4× size, which is the standard drive strength for logic cells, to be used in the synthesis procedure. A larger set of drive strengths for the buffer may also be included to ensure that buffers, a cell type actually present in the domino library, may be used for heavily loaded nets.

The bubble-pushing algorithm (not shown) may be subsequently applied to this larger library. Since bubble-pushing requires each cell to have an identified dual function defined as well, the domino library needs to define the dual cells. This approach to synthesis flow leads to a better quality of synthesis. In order to ensure that XOR cells are used in the synthesis flow (a well-known problem with domino synthesis), the XOR cell is instantiated 36 after synthesis with an explicit inverter and AND-OR cell. The inverter becomes trapped, but the structure does reflect that which would be achieved with the use of XOR gates.

In order to ensure that a standard static logic synthesis tool 34 can appropriately synthesize with domino logic, the timing models for the cells provided to the synthesis tool needs to be similar to those for static synthesis. This is done by removing the clock pin from the cell description 38, shown by box 40. The clock pin obviously needs to be attached to the pin in the final netlist, a task that is done later, shown by box 42.

In addition, since the evaluate time for the domino logic is critical, and since no falling transitions in the evaluate cycle are possible, the timing models are modified, shown in box 44. This is done by copying the rising transition delays to reflect the falling transition delay as well. If this were not done, and the falling transition time were set to a value of zero, or some lower value of delay than the rising delay, then after a logical negation operation, the critical delay would be to a falling transition. This is obviously an erroneous critical path, which the synthesis tool should not attempt to optimize.

The last difference between the synthesis approach that may be used in accordance with the invention and that described in the prior art is the use of a superior output phase assignment heuristic. This involves measuring the actual area saving possible instead of using an approximation.

Figure 4:
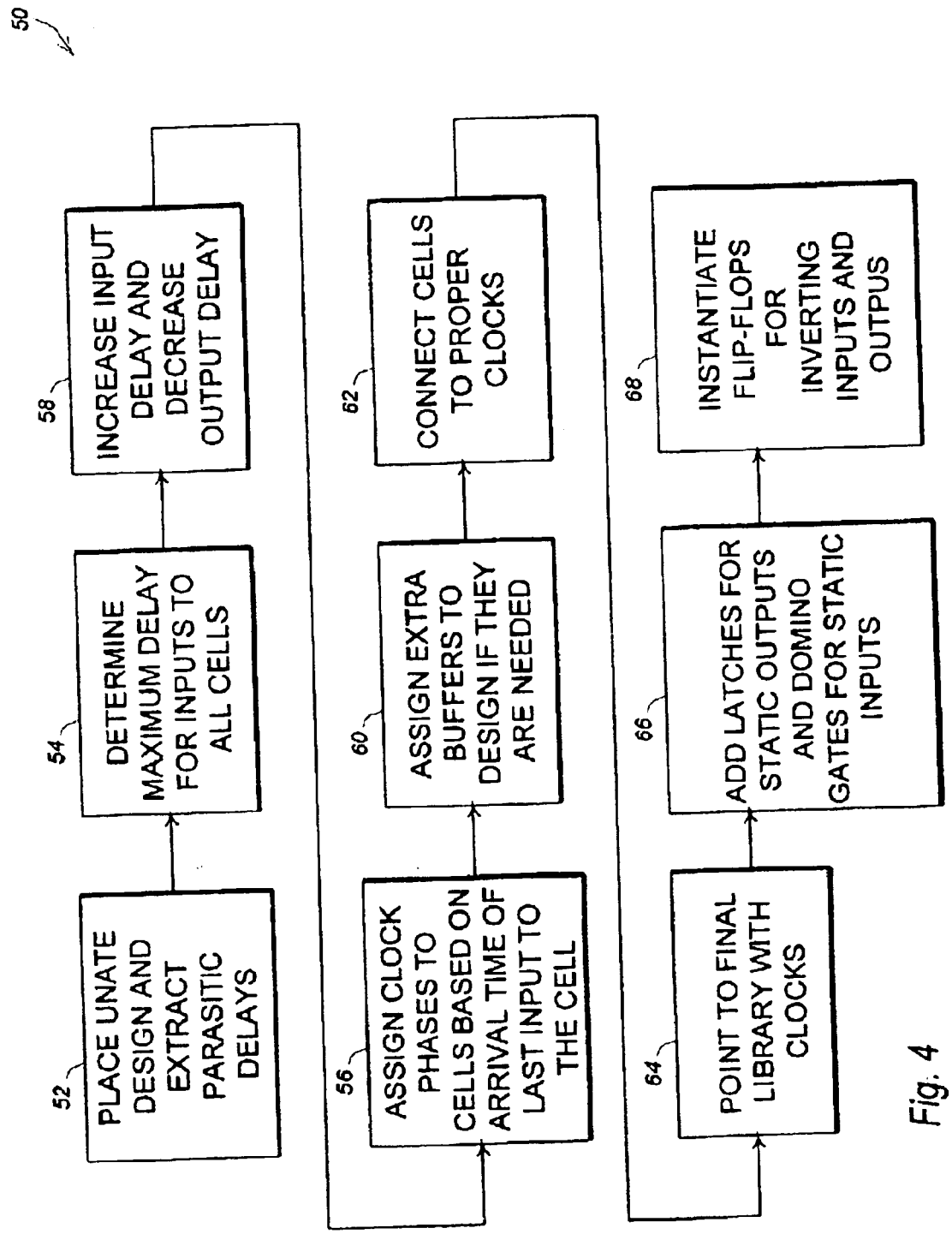
FIG. 4 shows a method for assigning appropriate phases to domino cells in a synthesized domino logic circuit after the domino blocks have been synthesized, according to a preferred embodiment of the invention.

A preferred method 50 for assigning the appropriate phases to the domino cells after the domino blocks have been synthesized on a first pass through the synthesis tool is illustrated in FIG. 4, to which reference is now additionally made. As shown, the unate design is placed and the parasitic delays are extracted 52. Then, the maximum delay for inputs to all cells is determined 54. This corresponds to partitioning the design into different timing regions. This is done by using a static timing analyzer to determine the arrival time for the last arriving input to the gate. If this input arrives during the first quarter in a design using four clock phases, the gate is assigned to phase $\phi 1$, if it arrives during the second quarter the gate is assigned to phase $\phi 2$, and so on. For a design employing three phase clocking, if the last arriving signal arrives during the first third of the period, the gate is assigned to phase $\phi 1$, and so on. In order to ensure that the arrival times of the signal reflect the actual wire lengths, this process is performed after an initial placement of the design has been done. This allows for a far more accurate estimate of actual wire lengths and routing congestion to be used to measure parasitics. Two potential issues emerge during the phase assignment problem that needs to be rectified by the addition of extra domino buffers. The first is that for non-critical paths all of the gates on a path may be on phase $\phi 1$, with none on phase $\phi 2$, $\phi 3$ or $\phi 4$. Since the rules of skew-tolerant domino logic require that a cell on phase $\phi 2$ be driven by a cell on $\phi 1$ or $\phi 2$, extra buffers need to be inserted on phase $\phi 2$, $\phi 3$ and $\phi 4$. Secondly, a gate may be driven by a cell on two different phases, say $\phi 3$ and $\phi 1$. If the gate is clocked on phase $\phi 4$, by the time it evaluates the gate on phase $\phi 1$ will be in a precharge state, leading to functional problems. Again, the problem can be corrected by inserting extra buffers for the input on phase $\phi 1$, to delay it to phase $\phi 3$, at which time it can safely drive a cell on phase $\phi 4$. The use of such extra buffers during phase assignment leads to a design that is larger, more power consuming, and more difficult to route (the extra buffers have to be added with an incremental placement).

The flow proposed reduces the number of buffers that are thus needed by checking the "slack" on the gates to arrange them in such a way as to reduce the number of buffers added without incurring any delay penalty. Thus, if four non-critical gates are sequentially arranged on phase $\phi 1$, with the output driving a flip-flop, it may be possible to connect the four gates to phase $\phi 1$, $\phi 2$, $\phi 3$, and $\phi 4$. In this way, no extra buffers are needed to meet the assignment rules for skew-tolerant domino logic, with no extra delay incurred in the design. A similar approach is employed for cells with inputs being driven by gates on different phases. The use of these techniques have shown that it is possible to reduce by 90% the number of extra buffers that need to be inserted during phase assignment.

For standard skew tolerant domino design, all of the clock phases should generally be assigned based upon the arrival time of the last input to the cell 56. For example, in synthesized skew-tolerant domino designs, the inputs arrive from a flip-flop that alters the timing conditions somewhat. In order to understand why this happens, consider a four phase synthesized skew-tolerant domino circuit in which each phase is assigned the same total logic delay, i.e., a quarter cycle. Since the inputs start at a hard edge, if data arrives at the start of the $\phi 2$ phase cells before a quarter cycle of $\phi 1$ is complete, the data cannot progress until the arrival of the $\phi 2$ clock. Similarly, if any data arrives at the cells triggered by the $\phi 3$ or $\phi 4$ edges before the corresponding clock arrives, it will have to wait for the rising edge of the clock. Delay can occur in the data arriving due to local process or environmental reasons, or, due to the lack of delay granularity in assigning gates to phases.

To reduce the probability of this happening, more gates should be assigned to the initial phases of the clocks than the latter. This ensures that any data in the critical path is less likely to encounter dead time while waiting for the assigned clock phases. A simple way to achieve this goal is by increasing the input delay specified in the design, and reducing the output delay 58. This causes the delay assigned to the first phase to be increased and that assigned to the last phase to be decreased. While this reduces the skew tolerance of the design somewhat, its judicious use can lead to a faster design.

After the phase assignment procedure, extra buffers are assigned to the design if they are needed 60 to compensate for timing delays. The cells in the phases regions are then connected to the proper clocks 62, the library modified to point to the final library (which has clock inputs) 64 with the correct clock phase tied to each cell. Latches may be added for static outputs and domino gates may be added for static inputs, noted in box 66.

At this juncture, it should be noted that there are some subtleties that should be considered during this process. If two flip-flops are connected back-to-back, a domino buffer may be inserted to ensure that shoot-through does not occur. Also, if two gates on different phases drive a single gate, extra buffers may be assigned to ensure that the fan-in gates are on the same phase. Finally, when inverting input or output signals are used, the appropriate flip-flop needs to be instantiated 68.

Using the design techniques described above, a domino synthesis flow may have significant speed increase, for example, on the order of about 50%, over static synthesis of similar functions.

Figure 5:
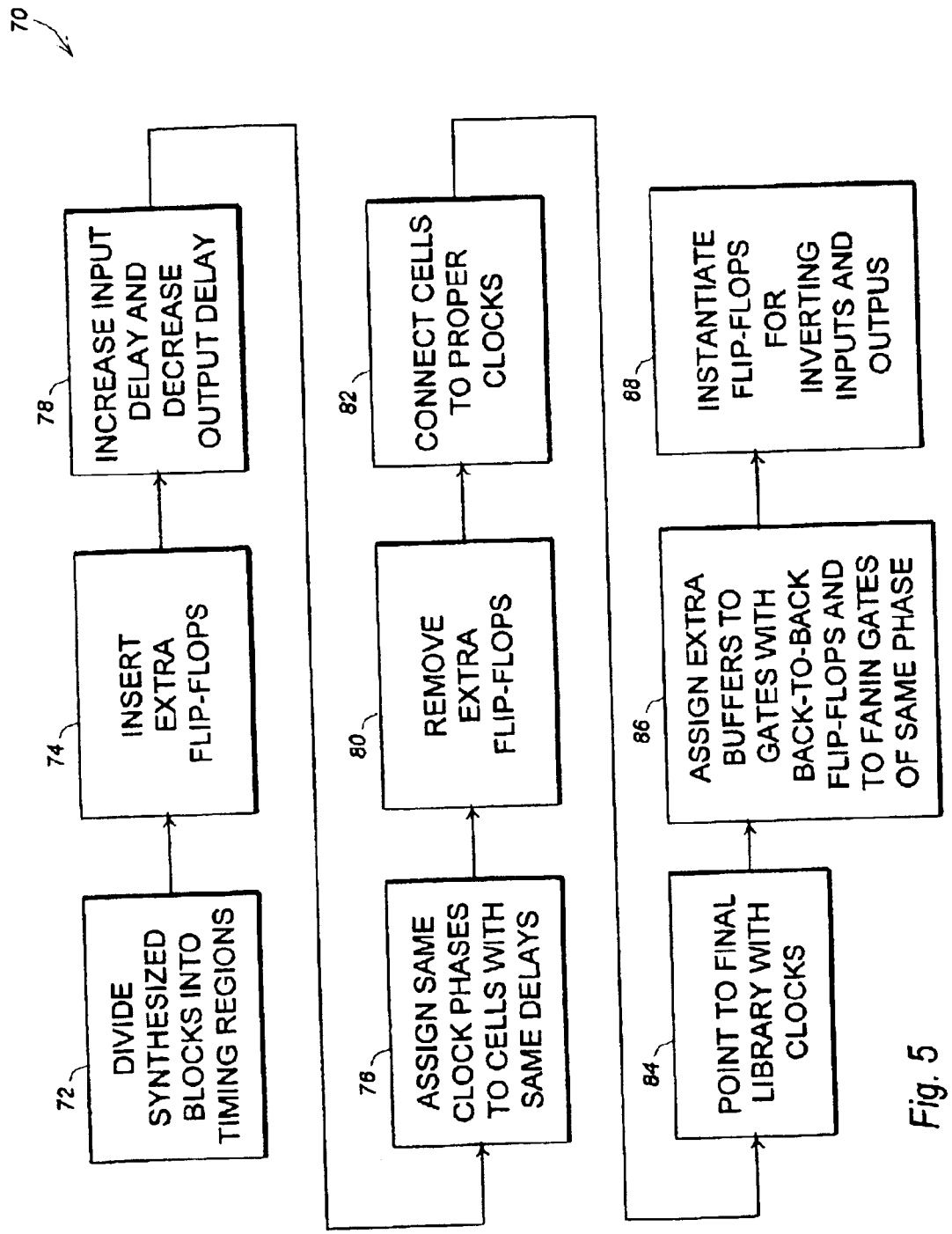
FIG. 5 shows an alternate method for assigning appropriate phases to domino cells in a synthesized domino logic circuit after the domino blocks have been synthesized, according to another preferred embodiment of the invention.

An alternate method 70 for assigning the appropriate phases to the domino cells after the domino blocks have been synthesized on a first pass through the synthesis tool is illustrated in FIG. 5, to which reference is now additionally made. As shown, the synthesized blocks are divided into different timing regions 72. Extra flip-flops are inserted 74 into the design, for example, by allowing the synthesis tool to assume that it needs to be pipelined deeper. For the DesignCompiler™ tool this may be done using the "pipeline_design" command. For this procedure, idealized flip-flops may be used to ensure that the phase assignment is not affected by the clock-to-q and setup delays of the flip-flops. For standard skew tolerant domino design, all of the phases should generally be assigned cells with the same amount of delay 76.

As described in the embodiment above, the input delay specified in the design is increased, and the output delay is decreased 78. This causes the delay assigned to the first phase to be increased and that assigned to the last phase to be decreased, as described above.

After the phase assignment procedure, the idealized flip-flops are removed or deleted 80. The cells in the phases regions are then connected to the proper clocks 82, the library modified to point to the final library (which has clock inputs) 84 with the correct clock phase tied to each cell. If two flip-flops are back-to-back, a domino buffer may have to be inserted to ensure that shoot-through does not occur, noted in box 86. Also, if two gates on different phases drive a single gate, extra buffers may have to be assigned to ensure that the fan-in gates are on the same phase also noted in box 86. Finally, when inverting input or output signals are used, the appropriate flip-flop are instantiated 88. In addition, latches may have to be added for static outputs and domino cells for static inputs.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A method for synthesizing a domino logic circuit design from a source circuit definition using a circuit synthesis tool, comprising:

generating a preliminary domino logic circuit design using said circuit synthesis tool; and performing "bubble-pushing" to eliminate at least some inverters from within said preliminary domino logic circuit design;

optimizing an attribute of said preliminary domino logic circuit design by substituting a static cell design for a domino cell design having a same function in said preliminary domino logic circuit design.

2. The method of claim 1 wherein said optimizing comprises optimizing a power attribute of said preliminary domino logic circuit design.

3. The method of claim 1 wherein said optimizing comprises optimizing a space attribute of said preliminary domino logic circuit design.

4. The method of claim 1 wherein said substituting is performed along signal paths that do not affect an overall circuit speed.

5. The method of claim 1 wherein said optimizing is performed by said circuit synthesis tool.

6. The method of claim 1 wherein said circuit synthesis tool is a static logic synthesis tool.

7. A method for synthesizing a domino logic circuit design from a logic circuit design containing logic cells using a static logic synthesis tool, comprising:

performing "bubble-pushing" to eliminate at least some inverters from within said domino logic circuit design;

determining a delay for inputs to said logic cells;

assigning clock phases to each of said logic cells based on arrival time of a last data input to said each of said logic cells; and connecting said cells to proper clocks having the assigned phases to form said domino logic circuit design.

8. The method of claim 7 further comprising assigning extra buffers to cells to compensate for clock signal delays.

9. The method of claim 7 further comprising completing said domino logic circuit design from final library including cells with clock signals.

10. The method of claim 7 further comprising adding latches for static output and domino gates for static inputs of said domino logic circuit design.

11. The method of claim 7 further comprising instantiating flip-flops for inverting inputs and output in said domino logic circuit design.

12. The method of claim 7 wherein said domino logic circuit design includes domino logic cells having dual cell functions.

13. The method of claim 7 further comprising increasing an input delay specification in said domino logic circuit design and reducing an output delay specification in said domino logic circuit design, wherein the delay assigned to a first clock phase is increased and the delay assigned to a last clock phase is decreased, wherein more gates are assigned to initial phases of a multi-phase design than in later phases.

14. The method of claim 7 further comprising bubble-pushing inverters in said logic circuit design to input and output locations and replacing an inverter being pushed by a cell of substantially a same strength.

* * * * *

UNITED STATES PATENT AND TRADEMARK OFFICE
CERTIFICATE OF CORRECTION

PATENT NO. : 6,954,909 B2
DATED : October 11, 2005
INVENTOR(S) : Razak Hossain, Bernard Bourgin and Fabrizio Viglione It is certified that error appears in the above-identified patent and that said Letters Patent is hereby corrected as shown below:

Column 9,
Line 32, after "tool" delete "and".
Line 35, after ";" add -- add --.

Signed and Sealed this

Third Day of January, 2006

JON W. DUDAS
*Director of the United States Patent and Trademark Office*